United States Patent [19]

Sahm et al.

[11] 4,016,014

[45] Apr. 5, 1977

[54] HIGH TEMPERATURE ALLOY

[75] Inventors: Peter R. Sahm, Neckargemund; Andrew R. Nicoll, Oftersheim, both of Germany

[73] Assignee: BBC Brown Boveri & Company Limited, Baden, Switzerland

[22] Filed: Dec. 31, 1974

[21] Appl. No.: 537,720

[30] Foreign Application Priority Data

Feb. 11, 1974 Germany .......................... 2406407

[52] U.S. Cl. .................................... 148/32; 75/171
[51] Int. Cl.$^2$ ........................................ C22C 19/07
[58] Field of Search ............... 75/171, 170; 148/32, 148/32.5

[56] References Cited

UNITED STATES PATENTS 3,552,953 1/1971 Lemkey et al. ...................... 75/171

Primary Examiner—R. Dean
Attorney, Agent, or Firm—Oblon, Fisher, Spivak, McClelland & Maier

[57] ABSTRACT

In a cast anisotropic body comprising a monovariant ternary eutectic alloy of Co, Cr and C, which is segregated into a matrix, and a carbide dispersed phase, the matrix phase consisting essentially of a Co-Cr solid solution and the dispersed phase consisting essentially of a plurality of high strength carbide fibers oriented in substantial alignment and integrally embedded in the matrix phase, the improvement which comprises having contained in the matrix and/or dispersed phase, Ni in an amount of from 1.5 to 8.5 % by weight based on the total weight of the composition.

10 Claims, 2 Drawing Figures

HIGH TEMPERATURE ALLOY

BACKGROUND OF THE INVENTION

1. Field of the Invention

This invention relates generally to alloys which are characterized by high temperature strength characteristics, and more particularly to alloys of the Co-Cr-C type.

2. Description of the Prior Art

Unidirectional solidification of lamellar eutectic alloys is known in the art, as indicated in Kraft U.S. Pat. 3,124,452, or Giessereforschung 24 (1972) pp. 45–53, for instance. That technique refers to a process in which the alloy is partially melted to form a liqud-solid interface. The interface is caused to be moved in a unidirectional fashion as the alloy is cooled through an appropriate transformation temperature. In this way the crystallites of each phase grow or form normal to the interface or solidification front between the solid and molten metal, i.e. in parallel to the direction in which the solidification front moves relatively to and through the alloy if the solidification front is at least substantially planar, which can be achieved by means of known cooling devices of appropriate kind. The conditions of unidirectional solidification can be determined by the following equation in which the ratio of temperature gradient G and growth rate $v$ is determined by $$\frac{G}{v} > \frac{m}{D} \cdot \Delta c + K_i C_i$$

wherein $m$ is the slope of the liquidus line at the point of deviation from eutectic composition, D is the diffusion coefficient of the liquid atoms, $\Delta c$ is the deviation of the melt composition and $K_i C_i$ is a constant governed by the impurity concentration $C_i$. Fulfillment of this condition serves to prevent the formation of dendrites or cell boundaries.

The melt is convectionless with no thermal fluctuations at the interface, in order to prevent the formation of growth bands or other growth defects.

This technique has been applied to Co-Cr-C alloys in the prior art. For instance, Thompson, U.S. Pat. No. 3,564,940, and German publication No. 1,928,258 report an alloy of the composition 35–45% wt Cr, 2.2–2.5% wt C and 52.4 – 62.8% wt Co. The Co-Cr-C alloys of the Thompson patent are aligned polyphase structures which solidify according to the monovariant eutectic structure: at a fixed pressure these compositions are monovariant thermodynamically and involve, in ternary systems for example, the three phase equilibrium between the melt and two solids over a temperature and composition range and not, as in the binary or pseudo-binary systems, at a fixed temperature and composition. Those compositions are located on a eutectic trough.

However, the alloys reported in Thompson are generally characterized by quite unsatisfactory strength characteristics, particularly time-dependent creep strength, and, therefore, the range of application of such alloys is limited. Although that prior patent indicates that its composition had a contemplated utility in the formation of gas turbine blades, in practice, those alloys have not been found to be sufficiently satisfactory.

Efforts had thus been made to improve the strength properties of this system of alloys, without success. For instance, methods are known for improving the high temperature strength characteristics, but not without sacrifice of other properties, such as corrosion resistance.

Lemkey et al U.S. Pat. No. 3,552,953, disclose another Co-Cr-C alloy of the composition 45.2 – 49.2 % wt Co, 49 – 53 % wt Cr and about 1.87 % wt C which are unidirectionally solidified such that a carbide of the form $Cr_{23}C_6$ is dispersed in a skeletal distribution in the matrix. This type of alloy, however, is quite different from the alloy of the present invention.

A need continues to exist for a technique of improving the high temperature strength characteristics of Co-Cr-C alloys, without sacrifice of other desirable properties of the alloy, particularly without sacrifice of corrosion resistance.

SUMMARY OF THE INVENTION

Accordingly, it is one object of this invention to provide a Co-Cr-C alloy which is characterized by excellent high-temperature strength properties without sacrifice to such other alloy properties as corrosion resistance.

This object and other objects of this invention as will hereinafter become more readily understood by the following description, have been attained by providing an anisotropic body comprising a monovariant ternary eutectic alloy of Co, Cr and C, which is segregated into a matrix phase and a carbide dispersed phase, the matrix phase consisting essentially of a Co-Cr solid solution and the dispersed phase consisting essentially of a plurality of high strength carbide fibers oriented in a substantial alignment, and integrally embedded in the matrix phase, the improvement which comprises replacing a portion of the C, Cr and/or Co in the matrix and/or dispersed phase with nickel in an amount of from 1.5 to 8.5 % wt, of the total composition, with the proviso that at least 1.5 % wt of carbon is not replaced.

BRIEF DESCRIPTION OF THE DRAWINGS

A more complete appreciation of the invention and many of the attendant advantages thereof will be readily attained as the same becomes better understood by reference to the following detailed description when considered in connection with the accompanying drawings, wherein.

DETAILED DESCRIPTION OF THE PREFERRED EMBODIMENTS

In the alloys of this invention the matrix is composed predominantly of Co and Cr and possibly some carbon in the well-known crystallographical form of $\gamma$Co solid solution, while the fibrous dispersed carbide phase is predominantly of the type $Cr_7C_3$ which is the chromium carbide appearing purely in the binary Cr-C marginal system of the present basic ternary Cr-Co-C system and having the same crystallographic structure as the carbide $Cr_{7-x-y}Co_xMe_yC_3$ in the preferred compositional ranges of the present invention. Essential to this invention is the presence of 1.5 to 8.5 % wt of Ni in the composition, which replaces some of the Co, Cr and/or C with the proviso that the composition contains at least 1.5 % wt C.

The preparation of the alloy body of this invention is by directional casting techniques as ddescribed by Thompson, supra, Kraft, supra, or Giessererforschung, supra. The microstructure of the body will show a carbide phase in fibrous or fibrillar form embedded in a matrix. The aspect ratio of the fibers is greater than or equal to 50 and will predominantly have a thickness of about 0.1 to 3 μm. Up to 49% of the fibers, however, may have a thickness dimension and/or a length to thickness ratio (aspect) other than as above indicated.

The fibers embedded in the matrix may have a length of at least 0.1 mm up to the length of the casting, although lengths of from 1 mm up to the length of the casting are preferred.

The carbide fibers may also have substituted therein a quantity of nickel of the same type as that which may be substituted into the matrix.

The composition of the carbide will have preferably the formula:

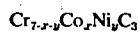

$Cr_{7-x-y}Co_xNi_yC_3$ wherein $x$ is an integer of from 0 to 2, and $y$ is an integer of from 0 to 1. It is also significant that the carbides which are embedded into the matrix are directionally oriented in an essentially, mutually parallel configuration. This is achieved by directionally solidifying the embedded carbides.

Preferably the matrix is formed of γ-Co and will have the composition of 25 – 35 % wt Cr and 62.5 – 72.5 % wt Co. Some carbon, and of course, some nickel may be in the matrix.

The alloys of this invention preferably will have a total relative Co-Cr-C concentration such that the alloy qualifies as a eutectic or near eutectic composition. For convenience, whenever the term eutectic is referred to, it is understood, that the term encompasses near eutectic compositions as well.

Figure 1:
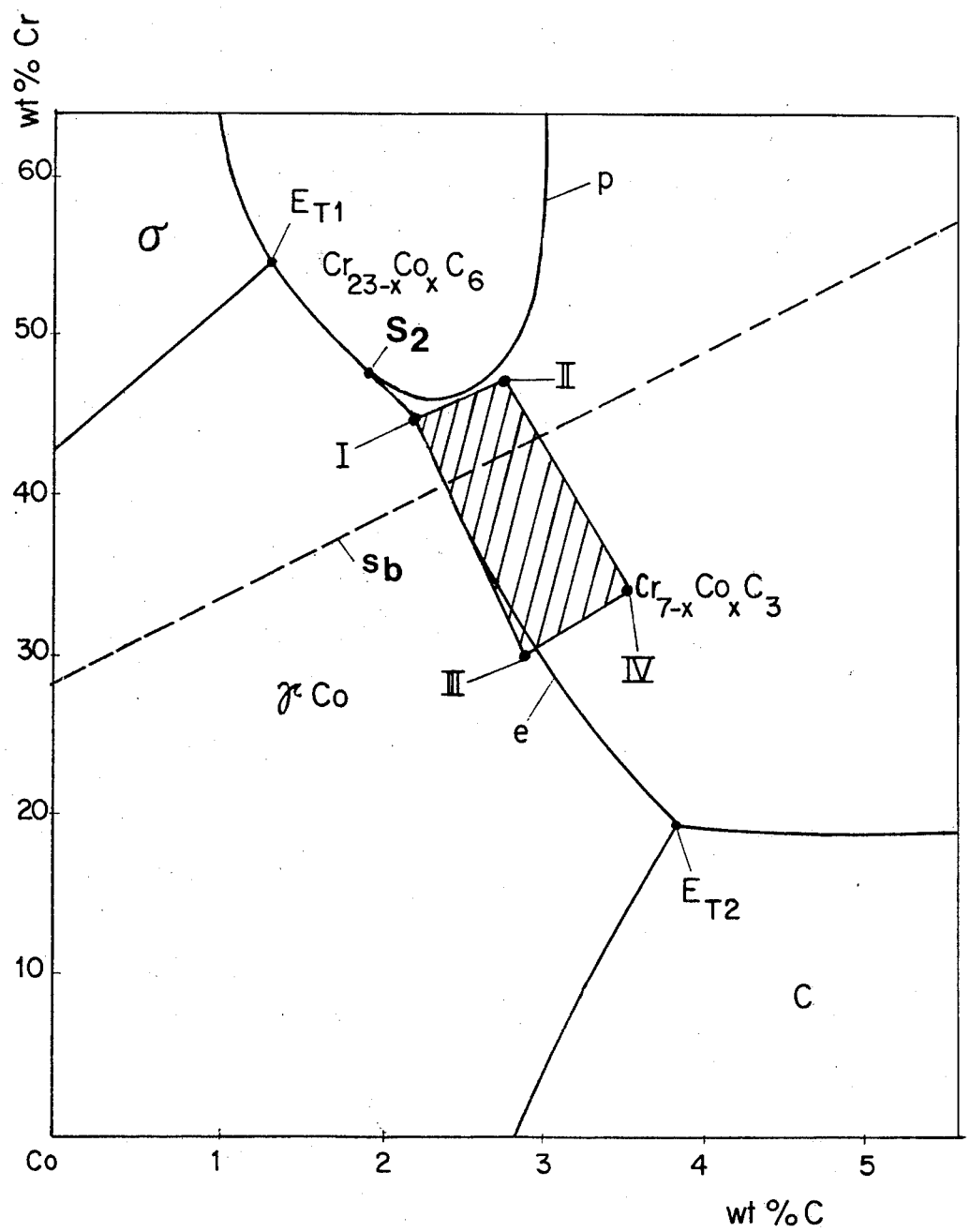
FIG. 1 is a phase diagram showing the compositional range with which the present invention is principally concerned.

The alloys of the present invention and their properties will be understood in detail more readily in the light of the following description with reference to a selected part of the primary crystallization phase diagram of the ternary Cr-Co-C system as represented schematically in the FIG. 1 of the enclosed drawings.

Considering the following remarks it has to be kept in mind that the pure ternary Cr-Co-C system as partly represented in the FIG. 1 is merely the basic alloy to be used with the specific additional alloy elements according to the present invention. Generally speaking, it can be said that the characteristic phase limits of the said basic phase diagram, and particularly the primary crystallization phase limits appearing in the liquidus surface of the three-dimensional phase diagram, as well as the corresponding solidification phase reactions basically maintain their typical form and position in the ternary Cr-Co-C diagram when the additional elements of the present invention are incorporated into the alloy, particularly in replacement of Cr and/or Co. for this reason it is justified to explain and characterize the basic alloy part of the complete alloys according to the present invention by useful and sufficient approximation in the said basic ternary diagram.

Turning now to the enclosed FIG. 1, this representation has to be understood as a section of the complete ternary diagram including the Co corner of the diagram. Accordingly, the Cr and C content in weight percentage have been marked along the ordinate and abscissa, respectively, starting from the Co corner.

In the diagram there are different primary crystallization regions well-known per se, mainly the solid solution regions σ and C which are of no interest in the present connection, further the chromium-richer carbide region $Cr_{23-x}Co_xC_6$ which is at most of minor interest in so far as this chromium-richer carbide for certain marginal compositions may exist in minor amounts in the dispersed phase besides the main carbide dispersed phase $Cr_{7-x}Co_xC_3$, the latter being the primary crystallization phase area of main interest for the present invention, and finally the solid solution primary crystallization region γ-Co being also of interest for the present invention.

All the lines between the different primary crystallization regions except the line $p$ which represents a peritectic trough, are standing for eutectic troughs well-known in the art, for instance from the Thompson and Lemkey specifications supra. Of substantial interest for the present invention is the eutectic trough $e$ which extends from above trough a first nonvariant eutectic point $E_{T1}$ and a second nonvariant eutectic point $S_2$ defined as the triple point between the three regions $Cr_{23-x}Co_xC_6$, $Cr_{7-x}Co_xC_3$ and γ-Co, to a third nonvariant eutectic point $E_{T2}$ defined as the triple point between $Cr_{7-x}Co_xC_3$, γ-Co and C. In this connection it may be of interest that it was not agreed to before the latest inquiries that the eutectic reaction in the Co-Cr-C system really does occur in a compositional point where the peritectic trough $p$ joins the eutectic trough $e$.

Now going further into details compositions in the nearer or farther vicinity of the section of the eutectic trough $e$ between the eutectic points $S_2$ and $E_{T2}$ are of major interest as basic alloys for the present invention. In this connection it has to be kept in mind that all the compositions being exactly on this section of the eutectic trough $e$ lead to simultaneous solidification of γ-Co and $Cr_{7-x}Co_xC_3$ resulting in the well-known, very fine grained eutectic structure, while any compositional deviation from the eutectic trough leads to primary crystallization of γ-Co on the one side and of $Cr_{7-x}Co_xC_3$ on the other side.

The carbide phase solidifies in a fibrous or similar crystal structure for alloy compositions exactly in the eutectic trough as well as on the carbide side thereof, i.e., in the $Cr_{7-x}Co_xC_3$ region thus rendering structures in principle useful for the present invention. However, the amount of carbide solidified as a part of the eutectic, that means simultaneous with, and dispersed in the matrix phase, has a very much finer crystal structure with a smaller fiber diameter compared with the amount of carbide which, due to an alloy composition on the carbide side of the eutectic trough has solidified from the melt by primary crystallization before the remaining melt attains the eutectic composition. Therefore, alloy compositions in the eutectic trough or quite near to it on the carbide side are the preferred ones for the present invention, while, in practice, considerable deviations into the carbide primary crystallization region are tolerable and even useful as well. To a certain extent, the primary carbide fibers with their greater diameter contribute favorably to the high mechanical strength of the alloy, while the specific additional alloy elements of the present invention are preserving the useful properties which might be otherwise affected by the coarser carbide fiber structure. This holds true particularly for corrosion resistance, creep strength, and other important properties of alloys of the present invention.

Compositional deviations from the eutectic trough into the solid solution region, i.e. generally into the γ-Co primary crystallization region are accompanied by formation of dendrites which is usually undesired and tolerable only to minor degrees.

Therefore, summarizing it can be stated that the best mode of operation of the present invention uses basic alloys with compositions on the eutectic trough $e$ between the non-variant eutectic points $S_2$ and $E_{72}$ including compositions deviating slightly from the correct eutectic one, while compositional ranges still useful comprise comparatively small deviations from the eutectic trough into the Co solid solution primary crystallization region on the one hand and considerably greater deviations into the carbide primary crystallization region on the other hand.

Occurence of the $Cr_{23-x}Co_xC_6$ carbide in the dispersed phase within the eutectic part of the alloy should generally be avoided because of the brittle character of this carbide. However, small amounts of this carbide besides the $Cr_{7-x}Co_xC_3$ carbide occuring in the vicinity of the peritectic trough $p$ may be tolerable.

By the way, suffice to remark that the foregoing explanation mentioned the carbide formula $Cr_{7-x}Co_xC_3$ with reference to the basic alloy, i.e. without the additional element Ni and $y = 0$ accordingly.

Now turning further into the details of the best mode of operation of the present invention most favourable results have been obtained by combining the abovementioned additional elements with basic alloy compositions within a region of the basic ternary Cr-Co-C diagram defined by the following corner compositions, now in terms of the complete system including Ni:

(The total composition of the alloy of this invention before substitution is optionally bracketed by the three component system.)

| | | | |
|---|---|---|---|
| 1. | Co,Ni = 53.1% | Cr,Ni = 44.7% | C,Ni = 2.2% |
| 2. | 50.25 | 47 | 2.75 |
| 3. | 67.15 | 30 | 2.85 |
| 4. | 62.5 | 34 | 3.5 |

The important proviso, however, is that the composition must contain at least 1.5% wt carbon. Deviations from the optimum, of course, will often occur in industrial applications. These parameters are satisfied in the total composition such that these parameters are partly satisfied by the composition of the matrix and partially satisfied by the composition of the carbide fibers contained therein. This is quite an important component of this invention since the result of said partial substitution in both the matrix and the fibers is an improved strength characteristic.

The compositional region with the corner points I to IV has been pointed out by shading in the enclosed drawing.

Of particular interest for the present invention are basic alloys with compositions on the line $s_b$ in the diagram This line represents a pseudo-binary cut within the present ternary system, this pseudo-binary cut behaving like a binary eutectic with γCo and $Cr_{7-x}Co_xC_3$ as the partner of a eutectic reaction represented by the section of the said line $s_b$ with the eutectic trough $e$.

As to the diagram it should be kept in mind that the phase boundary lines are a schematic representation which in one or the other section eventually could and will be amended in view of future research and measurements. Nevertheless, the diagram is held to be fully sufficient in explaining and identifying the basic alloy for use with the present invention.

As stated supra the eutectic alloy for use with the present invention preferably consists of γCo as the matrix phase and $Cr_{7-x}Co_xC_3$ as the dispersed phase, and it is an important aspect of the present invention that the additional element Ni will be incorporated in the matrix and/or the dispersed phase during solidification.

The quantity of Ni present in the composition ranges from 1.5 to 8.5% wt. Below 1.5% wt., there is only very slight improvement in high temperature corrosion resistance. Above 8.5%, the high temperature strength, and in particular, the creep strength begins to fall below even that of the basic alloy without nickel.

The substitution of nickel, however, cannot be so great as to eliminate less than 1.5% wt. of the carbon. If the carbon content should fall to less than 1.5% wt., an increasing unidirectional orientaton of the fibers.

The effect of the Ni additions is believed to be an increase in the mobility of the dislocations in the Co-Cr matrix, a lowering of the hexagonal-cubic phase transition temperature of 950° C for the untreated matrix, and a reduction in the rate of oxygen and sulfur diffusion.

Those alloys having 1.5 to 3% Ni, most preferably 2%, are characterized by the lowest hexagonal-cubic transition temperature, approximately 850° C. It also tends to lessen the convertability of the matrix, so that under normal conditions of temperature variation, the transition can no longer occur because the diffusion rates of the atoms involved are sufficiently decreased. The Ni addition in these amounts tends ot have a smoothing effect on the fibers which tends ot enhance the room temperature rupture strengths. Moreover, the use of Ni in these amounts, does not seem to adversely affect the high temperature strength or creep behavior of the alloy.

Alloys containing 7 to 8.5% wt. nickel, tend to have somewhat different characteristics than those which contain 1.5 to 3% wt. Within the range 7 to 8.5%, particularly 8% Ni, the alloy is characterized by quite superior corrosion resistance. The extent of corrosion in a fused salt bath of an alloy containing 8% Ni is about ½ of the alloy without the Ni addition. This result is believed to be due to the effect the Ni does not reduce the rate of diffusion of such corroding elements as oxygen or sulfur.

The other desirable properties of the alloy are not adversely affected. Especially good compositions are attained wherein 2% Ni is used to replace 0.1% wt. C and 1.9% wt. Co, as representative of alloys of this invention containing relatively smaller amounts of Ni. When the alloy contains 1.5 to 3% wt. Ni, good results are attained when the carbon content is between 2.2 and 2.3% wt.

Representative of alloys of this invention which contain relatively larger amounts of Ni, is the alloy in which 8% wt. Ni is used to replace 0.3% wt. C and 7.7% wt Co.

When the alloy contains 7 to 8.5% Ni, good results are attained when the carbon content is 2.0 to 2.2% wt.

Having generally described the invention, a more complete understanding can be obtained by reference to certain specific examples, which are included for purposes of illustration only and are not intended to be limiting unless otherwise specified.

EXAMPLES

The components indicated in the following Table were melted in an alumina crucible after weighing and were brought into the desired mold, e.g., rod-shaped, by a vacuum drawing method. the directional solidification proceeded in a protective atmosphere with hardening rates of about 7 cm/hr and temperature gradients around 100° K/cm. After that, the specimens were brought into the desired shape (here rod-shaped with 5 mm diameter and 60 mm length) by free-cutting machinery. The fibers were made parallel to the rod axis by the indicated procedure.

Analytical tests conducted on the resulting alloys are reported in the following Table and accompanying FIG. 2. As can be seen in this Table, for alloys containing 1.5 to 3% wt. Ni, the rupture strengths at room temperature and high temperature in enhanced without adverse effects on the creep behavior. For alloys containing 7 to 8.5% wt. Ni, the corrosion resistance is quite good.

Moreover, it should also be noted that at least in the case of the nickel-rich alloy of the invention, the absolute values of the notch impact strength is greatly increased and the undesirable minimum seen in the curve for the basic alloy at the middle temperatures is not present. This is quite clearly shown in the FIG. 2.

Figure 2:
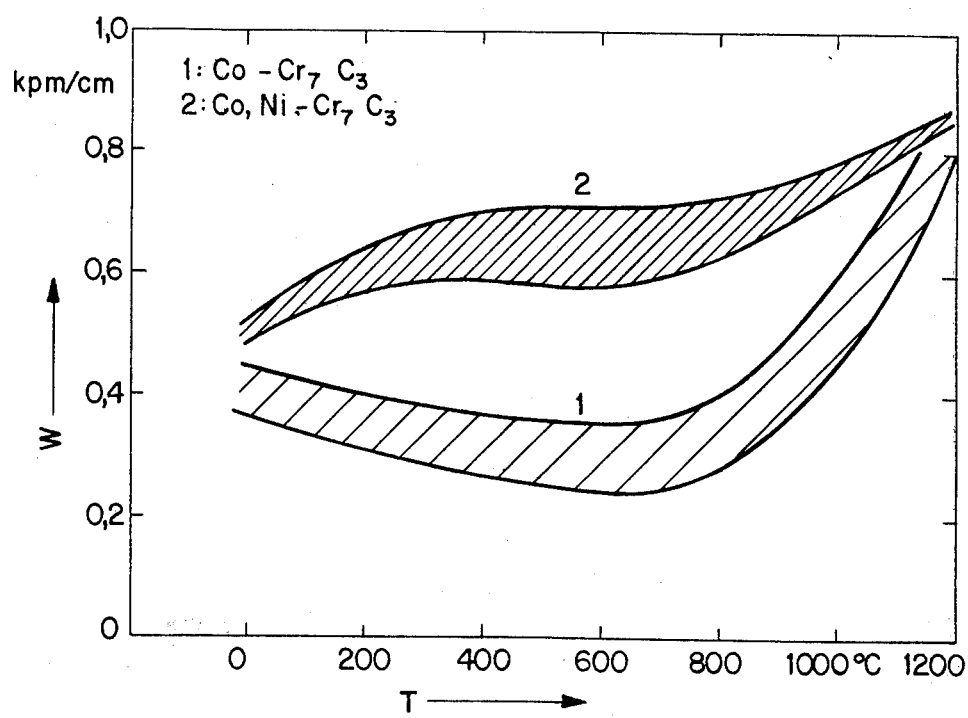
FIG. 2 is a diagram showing the dependence of notch impact strength on temperature of alloys according to the present invention.

Furthermore, the above mentioned choice of alloy is distinguished by a very high notch impact strength over the entire temperature range as can be seen in the accompanying FIG. 2, curve 2. It is seen from the curves that there is not only a general increase with respect to the basic alloy (curve 1), but simultaneously also a leveling out of the minimum in the curve of toughness, as compared with the basic alloy. This is a highly desirable characteristic for such high temperature applications as used in forming gas turbine blades, since practically this whole temperature range is traversed during turbine operation.

The values in the Table are self-explanatory. The tensile strength of the alloys of this invention are quite significantly improved as compared with the untreated alloy. The service life at high temperatures is as good or only very slightly deteriorated, while the high-temperature corrosion resistance, which is especially important for the introduction of such alloys into gas turbine construction, is obviously a remarkable improvement.

TABLE

| Composition by wt% | | | |
|---|---|---|---|
| Co | 56.9 | 55 | 49.2 |
| Cr | 40.7 | 40.7 | 40.7 |
| C | 2.4 | 2.3 | 2.1 |
| Ni | — | 2 | 8 |
| Tensile strength $MN/M^2$ | 25° C:1400 | 25° C:1500 | 25° C:1600 |
| | | 1000° C: 470 | 1000° C: 430 |
| Service Life (creep strength) at 150 $MN/m^2$ and 1000° C in hours | 100 | 100 | 90 |
| Notch impact strength DVMK-test rod | 25° C:4 400° C:3 1000° C:4 | No measurements | 25° C:5 400° C:6 900° C:7 no minimum |
| High temperature corrosion resistance | Basic alloy about equal to the best superalloy (e.g. IN 738) | Better than the basic alloy (factor 1.5) | Corrosion resistance in sulfur and chlorine-containing fused salt baths twice as good as basic alloy (factor 2) |

Having now fully described the invention, it will be apparent to one of ordinary skill in the art that many changes and modifications can be made thereto without departing from the spirit or scope of the invention as set forth herein.

What is claimed as new and intended to be covered by letters patent is:

1. In a cast anisotropic body comprising a monovariant ternary eutectic alloy of Co, Cr and C, which is segregated into a matrix phase and a carbide dispersed phase, the matrix phase consisting essentially of a Co-Cr solid solution and the dispersed phase consisting essentially of a plurality of high strength carbide fibers predominantly of the $Cr_7 C_3$ type oriented in substantial alignment, and integrally embedded in the matrix phase, the improvement which comprises:

replacing a portion of the Co, Cr and/or carbon in the matrix and/or dispersed phases of said alloy with nickel in an amount of 1.5 weight % to 8.5 weight % based on the total weight of the composition, with the proviso that the composition contains at least 1.5 weight % carbon, wherein the final composition of said eutectic alloy is defined by that region of the Co, Cr, C phase diagram of FIG. 1 defined by the following boundaries:

| | | | |
|---|---|---|---|
| 1. | Co,Ni = 53.1% | Cr,Ni = 44.7% | C,Ni = 2.2% |
| 2. | 50.25% | 47% | 2.75 |
| 3. | 67.15% | 30% | 2.85% |
| 4. | 62.5% | 34% | 3.5% |

2. The alloy of claim 1, wherein said Ni is present in an amount of 1.5 to 3% wt.

3. The alloy of claim 2, wherein the carbon content is 2.2 to 2.3% wt.

4. The alloy of claim 1, wherein said Ni is present in an amount of 7 to 8.5% wt Ni.

5. The alloy of claim 4, wherein the carbon content is 2.0 to 2.2% wt.

6. The alloy of claim 1, wherein 2% by weight Ni replaces 0.1% wt C and 1.9% Co.

7. The alloy of claim 1, wherein 8% by weight Ni replaces 0.3% by weight C and 7.7% wt Co.

8. The body of claim 1, wherein the matrix essentially consists of γ-Co.

9. The body of claim 1, wherein the matrix contains 25–35% wt Cr and 62.5 – 72.5% wt Co.

10. The body of claim 1, in which said carbide dispersed phase is substantially of the formula $Cr_{7-x-y}Co_xNi_yC_3$, wherein $x$ is an integer of from 0 to 2 and $y$ is an integer of from 0 to 1.

* * * * *